US011650675B2

United States Patent
Martin et al.

(10) Patent No.: US 11,650,675 B2
(45) Date of Patent: May 16, 2023

(54) INPUT DEVICE WITH MOVABLE HANDLE ON A CAPACITIVE DETECTION SURFACE AND CAPACITIVE COUPLING DEVICES

(71) Applicant: PREH GMBH, Bad Neustadt a. d. Saale (DE)

(72) Inventors: Michael Martin, Unsleben (DE); Benedikt Schmidt, Fladungen (DE); Markus Klein, Salz (DE)

(73) Assignee: Preh GmbH, Bad Neustadt a.d. Saale (DE)

( * ) Notice: Subject to any disclaimer, the term of this patent is extended or adjusted under 35 U.S.C. 154(b) by 123 days.

(21) Appl. No.: 16/955,507

(22) PCT Filed: May 6, 2019

(86) PCT No.: PCT/EP2019/061534
§ 371 (c)(1),
(2) Date: Jun. 18, 2020

(87) PCT Pub. No.: WO2020/011416
PCT Pub. Date: Jan. 16, 2020

(65) Prior Publication Data
US 2020/0319722 A1 Oct. 8, 2020

(30) Foreign Application Priority Data
Jul. 12, 2018 (DE) .................... 10 2018 116 876.4
Aug. 23, 2018 (DE) .................... 10 2018 120 575.9

(51) Int. Cl.
*G06F 3/0362* (2013.01)
*G06F 3/039* (2013.01)

(52) U.S. Cl.
CPC .......... *G06F 3/0362* (2013.01); *G06F 3/0393* (2019.05)

(58) Field of Classification Search
CPC ................ G06F 3/0362; G06F 3/0393; H03K 2217/94073; H03K 17/975
See application file for complete search history.

(56) References Cited

U.S. PATENT DOCUMENTS 7,602,376 B1 * 10/2009 Hetherington ........... G05G 1/08
345/161
9,354,720 B1 * 5/2016 Hsieh .................... G06F 3/0416
(Continued)

FOREIGN PATENT DOCUMENTS

DE 102007024874 A1 12/2008
DE 102014218493 A1 3/2016
(Continued)

OTHER PUBLICATIONS

The International Search Report and The Written Opinion for PCT/EP2019/061534, dated Jul. 9, 2019, ISA/EP, Rijswijk, The Netherlands.

*Primary Examiner* — Temesghen Ghebretinsae
*Assistant Examiner* — Karin Kiyabu
(74) *Attorney, Agent, or Firm* — M&B IP Analysts, LLC

(57) ABSTRACT

A rotary knob having (inter alia, adjustable) a coupling electrode and capacitive coupling devices for placing on a touch screen is provided. Depending on the position of the rotary knob or of the coupling electrode, contact of a corresponding partial region of the touchscreen is detected. The rotary knob is designed detect and ignore disturbing influences such as drops of water.

21 Claims, 11 Drawing Sheets

(56) References Cited

U.S. PATENT DOCUMENTS

| | | | |
|---|---|---|---|
| 2005/0110768 A1* | 5/2005 | Marriott | G06F 3/03547 |
| | | | 345/173 |
| 2007/0247421 A1* | 10/2007 | Orsley | G06F 3/0362 |
| | | | 345/156 |
| 2014/0042004 A1 | 2/2014 | Tseng | |
| 2014/0267039 A1* | 9/2014 | Curtis | G06F 3/0338 |
| | | | 345/161 |
| 2018/0181251 A1* | 6/2018 | Bolender | G06F 3/041661 |
| 2018/0314357 A1* | 11/2018 | Klein | G06F 3/045 |
| 2019/0391672 A1* | 12/2019 | Fischer | G06F 3/044 |
| 2020/0019263 A1* | 1/2020 | Korherr | G01D 5/3473 |

FOREIGN PATENT DOCUMENTS

| | | | | |
|---|---|---|---|---|
| EP | 0837482 A2 * | 4/1998 | | |
| EP | 2187290 A1 | 5/2010 | | |
| EP | 2511807 A2 * | 10/2012 | | F24C 7/082 |
| WO | WO-2006010513 A1 * | 2/2006 | | B60K 37/06 |
| WO | WO-2006036950 A1 * | 4/2006 | | A47B 57/00 |
| WO | 2017072232 A2 | 5/2017 | | |
| WO | 2018137944 A1 | 8/2018 | | |

\* cited by examiner

INPUT DEVICE WITH MOVABLE HANDLE ON A CAPACITIVE DETECTION SURFACE AND CAPACITIVE COUPLING DEVICES

This application claims priority under 35 U.S.C. § 371 to the International Application No. PCT/EP2019/061534, filed May 6, 2019, and to the German Application No. 10 2018 116 876.4, filed Jul. 12, 2018 and to the German Application No. 10 2018 120 575.9, filed Aug. 23, 2018, the contents of which are hereby incorporated by reference.

BACKGROUND

The disclosed embodiments relate to an input device having a capacitive detection device, wherein the detection device has a detection surface while forming an array, which is associated with the detection surface, of junction points, which are respectively defined by a point of intersection of two array electrode, and wherein a handling means is movably disposed on the detection surface defined by the detection device and the detection device is configured for detecting the position of the handling means.

For example, the capacitive detection device is a capacitive touchpad or a capacitive touchscreen. The input device further includes an electronic evaluation unit, which is connected in an electrically conducting manner to the array electrodes, in order to form, by means of the electrode array, an associated array of measuring capacitances, which is preferably generated in a sequence in time, for the spatially resolving detection of a capacitive influence on the input surface. The input device includes a handling means, which is movably disposed on the detection surface in order to perform an operating input when the handling means is moved, in particular when the handling means is manually moved while being touched by an operator.

Furthermore, the input device comprises a coupling electrode, which is at least partially moved along with the handling means, in order to cause at least one of the measuring capacitances to be detectably influenced, from which positional and/or movement information can be derived. Such a combination of a touchpad or touchscreen with an input device formed by a handling means movably disposed thereon is becoming increasingly popular, because flexible inputting options are being provided in this manner, and because, particularly in the case of a touchscreen, a variety of functions and function information can be associated with the handling means due to the flexible displaying options. On the other hand, however, the handling means provides a familiar haptic feedback and can easily be located by feel by the user without any visual contact. Because of the intended utilization for position detection of the region of the capacitive electrode structure, which is located underneath the handling means and covered by the handling means, a capacitive coupling between the handling means, particularly of the coupling electrode provided therein, and the capacitive touchscreen or capacitive touchpad is required. Generally, this capacitive influence can be distinguished only with great difficulty from a capacitive influence due to external interfering influences caused by to water-containing liquids.

It was found that the capacitive influence between the coupling electrode and the array electrode cannot be reliably distinguished from interfering influences, and that thus, the detection of the position of the handling means is unreliable.

Against this background, there was a demand for a generic input device in which an improved, targeted capacitive coupling is obtained between the capacitive detection device, e.g. the capacitive touchscreen, and the handling means, in particular with the coupling electrode provided on the handling means. This object is achieved by an input device according to claim 1. An equally advantageous use is the subject matter of the independent claim. Advantageous embodiments are in each case the subject matter of the dependent claims. It must be noted that the features cited individually in the claims can be combined with each other in any technologically meaningful manner and represent other embodiments of the invention. The description, in particular in connection with the figures, additionally characterizes and specifies the various disclosed embodiments.

SUMMARY

The embodiments relate to an input device including a capacitive detection device, in which case the detection device has a detection surface while forming an array of array electrodes associated with the detection surface. The array electrodes, also referred to as electrodes in short, are disposed in a common plane or on two or more parallel planes, for example. The arrangement and position of the array electrodes is preferably described by a regular, more preferably right-angled, imaginary grid structure, also referred to as a grid in short, wherein the position of the measuring fields to be generated by the array electrodes is defined by the junction points.

In this case, a junction point is defined by a point of intersection of two array electrodes, for instance. The term electrode is supposed to imply the configuration of the electrode concerned from a conductive material, e.g. of metal or a metallic alloy. For example, the detection device is a capacitive touchpad or a capacitive touchscreen. According to the invention, an electronic evaluation unit is provided, which is electrically connected, preferably in an electrically conducting manner, to the array electrodes, in order to form, by means of the array of array electrodes, an associated array of electrical measuring fields, which is preferably generated in a sequence in time and varies in time, for the spatially resolving detection of a capacitive influence on the detection surface. For example, this is a capacitive detection device with a projected capacitive technology, in particular with a mutual-capacitance structure. In the mutual-capacitance structure, measuring fields, and thus measuring capacitances, are generated at the junction points between two electrically insulated intersecting electrode structures. In commercially available touchpads or touchscreens, the junction points are arranged in a right-angled grid.

The evaluation unit is capable of measuring the several measuring capacitances and influences on them. If the respective measuring field is influenced by the external approach of an object, the electrical measuring capacitance measured by the evaluation unit, e.g. at the respective junction point, is altered and detected, and can be associated with a location on the detection surface due to the electrode structure, preferably an electrode structure with a pattern of rows and columns.

According to the some embodiments, the input device includes a handling means, which, providing a first degree of freedom of movement, is disposed on the detection surface by means of a supporting means, preferably attached by means of the supporting means, so as to be movable along an adjustment path, in order to perform an operating input in the case of movement, particularly while the handling means is touched by an operator. For example, this is a handling means that is mounted so as to be translationally movable along a linear adjustment path in a direction parallel to the detection surface. Preferably, the handling means is mounted on the detection surface in a manner rotatable about an axis of rotation orthogonal to the detection surface, thus qualifying the input device as a rotary adjuster.

According to the some embodiments, a coupling electrode moved along with the handling means is also provided. This is an electrode, which, as mentioned above, implies the use of a conductive material. Moreover, the term "coupling electrode" is to imply a capacitive coupling with at least one of the measuring fields. For example, the coupling electrode is configured so as to be electrically insulated from the evaluation unit. It may have a single-part of multi-part configuration, with the several parts preferably being connected in an electrically conductive manner. In another embodiment, it is configured and arranged so as to be coupled with the user in an electrically conductive or capacitive manner. Furthermore, several coupling devices made of a conductive material are provided, which are distributed along the adjustment path, disposed on the detection surface and are each electrically insulated. The coupling devices are in each case arranged and configured in such a way that not only exactly one, but several adjacent measuring fields are respectively capacitively coupled to an associated one coupling device of the several coupling devices, wherein the measuring fields associated with one coupling device in each case define exactly one, preferably contiguous, partial region of the detection surface. This is accomplished, for example, by a coupling surface of the coupling device facing towards the detection surface having a size which, in its two orthogonal directions, is preferably several times greater than the mean array electrode distance, e.g. the mean distance of the junction points.

According to the some embodiments, several positions of the handling means are provided along the adjustment path thereof, in which the coupling electrode, depending on the position, is arranged most closely adjacent to at least one of the coupling devices, in order to form another capacitive coupling between exactly these position-dependent specific coupling devices and the coupling electrode, or at least, depending on the position, be capacitively coupled to them. In other words, for several different positions of the handling means along the adjustment path, one or more specific coupling devices from the plurality of coupling devices is respectively disposed most closely adjacent to the coupling electrode, so that the latter, depending on the position, form a capacitive coupling with the respective coupling device or contact them electrically.

The entirety of the measuring fields associated with a respective coupling device defines a, preferably contiguous, partial region of the detection surface.

According to the some embodiments, the electronic evaluation unit is configured for detecting the position-dependent influence on the measuring fields caused by the capacitive coupling in order to obtain and output a positional information of the handling means. In other words, the evaluation unit is capable of identifying the influence on the respective measuring fields caused by the position of the handling means, and thus of the coupling electrode, and thus associate a positional information with the influence and output it to a higher-level control device for performing a controlling or switching function.

A capacitive coupling between the coupling electrode and a measuring field is accomplished when the influence resulting from the coupling can be reliably detected by means of the electronic evaluation unit. In order to be capable of reliably extracting the capacitive coupling from the signal, the useful signal has to clearly set itself apart from the background noise. Thus, the signal-to-noise ratio has to be sufficiently large, for example.

According to the some embodiments, this is accomplished by the coupling between the coupling device and the array electrodes being achieved not only with a single measuring field, but with several measuring fields and thus with a plurality of measuring fields caused by a plurality of array electrodes. It is accomplished, by disclosed the solution, that a multiple influence on the measuring fields is accomplished by the coupling electrode for each coupling device. Moreover, the accuracy of the position detection can be increased and made robust with respect to external interfering influences by the water-containing liquids by means of the capacitive coupling with several different junction points. Moreover, the distance between the coupling electrode and the array electrode to be bridged by the capacitive coupling can be minimized by the coupling devices provided according to the disclosed embodiments.

For example, the capacitive influence characteristic for a certain position and/or movement may be determined by simulation or calibration and stored as data in a storage medium. During the evaluation process, the evaluation unit may then access these data and utilize them for evaluating the current position and/or movement, e.g. using a correlation algorithm or the like. For example, the detected capacitive influences are used by the evaluation unit as data for an analytic evaluation, which includes the use of one- or multi-dimensional Gaussian functions of the like, for example. For example, the detected capacitive influences are used by the evaluation unit as data for statistical evaluation.

According to a preferred embodiment, the handling means, in order to provide a second degree of freedom of movement, is supported so as to be movable in relation to the detection surface, in a restoring manner from a rest position into an end position, e.g. is supported in a tiltable manner relative to an imaginary axis orthogonal to the detection surface, or in a manner displaceable substantially orthogonally to the detection surface, or in a manner displaceable parallel to the detection surface. In this case, the end position is selected in such a manner that in each case, several measuring fields, which are associated with several partial regions and which, in their entirety, define a preferably contiguous multi-region of the detection surface, are capacitively influenced in the end position due to the capacitive coupling or electrical contacting. In this case, the electronic evaluation unit is configured for detecting the capacitive influence on the measuring fields associated with the multi-region caused by the capacitive coupling or electrical contacting, in order further to obtain and output a displacement information of the handling means.

An additional functional capability, such as a so-called push functionality, is reliably and simply realized by the capacitive influence on several measuring fields by means of several coupling devices. In the associated displaced or tilted end position, a touching contact between the coupling electrode and several, e.g. positionally associated, or all coupling devices is produced, for example, in order to reliably detect the position of the handling means shifted into the end position.

For example, the coupling devices associated with an end position, and thus to a multi-region, are situated most closely adjacent to each other. According to an even more preferred embodiment, the handling means is supported so that it can be displaced into several different direction-specific end positions, and one direction-specific multi-region is provided for each direction-specific end position. In this case, the electronic evaluation unit is configured to detect the capacitive influence on the measuring fields associated with the direction-specific multi-regions caused by the first and the second capacitive coupling, in order to obtain and output a direction-specific displacement information of the handling means. For example, different coupling device are associated with the multi-region for a tilting of the handling means in the direction "right" than for a tilting of the handling means in the direction "left". Thus, a so-called "joystick" or "rocker key" functionality is realized in a reliable and simple manner.

For example, the coupling electrode at least partially consists of a sheet-metal stamped bent part and is positively or non-positively connected to the handling means. For example, the coupling electrode consists at least partially of a ball bearing whose inner race or outer race is connected to the handling means, wherein the inner or outer race is in capacitive or electrically conductive contact with several coupling devices in the end position. Preferably, the coupling electrode consists of a sheet-metal stamped bent part and a ball bearing capacitively or electrically connected therewith.

Preferably, the partial regions and/or a multi-region extend across an adjustment path defined on both sides of the arrangement profile of the coupling devices. In this way, the evaluation unit can more easily detect the interfering influence of a drop of water located, for example, only on one side of the adjustment path and thus only partially within a partial region or a multi-region.

Preferably, the distance in the respective position between the coupling device associated with the position, because that is coupling device most closely adjacent to the coupling electrode in the respective position, and the coupling electrode is in each case less than 1 mm, more preferably less than 0.5 mm, and most preferably less than 0.1 mm.

According to a preferred embodiment, the several coupling devices are attached to the supporting means. Preferably, the several coupling devices are connected positively, non-positively and/or by substance-to-substance connection to the supporting means; for example, the coupling devices are attached to the supporting means by molding in molding processes, e.g. injection overmolding. For example, an integral connection between the coupling devices and the supporting means is realized by means of their being produced in a 2K injection-molding process, or by partially plating a plastic.

Preferably, the handling means is mounted on the detection surface in a manner rotatable about an axis of rotation orthogonal to the detection surface, thus qualifying it as a rotary adjuster. The adjustment path described by the arrangement of the coupling devices thus encloses a substantially circular inner region of the detection surface.

According to a preferred embodiment, there is at least one measuring field in the inner region, and thus at least one array electrode, not associated with any partial region that, depending on the position, is possible, and not with any multi-region. In this manner, the inner region of the detection surface can be used for detecting further functionalities of the input device, such as a detection of the touch of a user or the like, given a corresponding configuration of the rotary adjuster, e.g. as a rotary ring.

Preferably, the several coupling devices are distributed about the axis of rotation, e.g. uniformly distributed in the circumferential direction.

According to a preferred variant, the supporting means form a ring of plastic, e.g. of a thermoplastic material, and the several coupling devices are accommodated in the plastic ring. For example, the ring has an end face constituting a contact surface for arrangement on the detection surface.

Apart from supporting the rotary adjuster and accommodating the several coupling devices, the plastic ring serves for physically separating the inner region of the detection surface from the rest of the detection surface, the outer region, at least partially. For example, the plastic ring keeps a drop of water from entering the inner region from the outer region, and vice versa. In this way, the evaluation unit can more easily detect the interfering influence of a drop of water, which in this case is located, for example, only on the outside of the detection surface and thus only partially within a partial region or a multi-region.

For example, the coupling devices are configured in a rod-shaped manner. For example, the coupling device has in each case one main extending direction orthogonal to the detection surface. In one configuration, the first end face, also referred to as the coupling surface, with which the coupling device faces towards the measuring field and thus towards the associated array electrodes, and the second end face of the coupling device, also referred to as the decoupling surface, which faces towards the coupling electrode, are each parallel to each other. In another configuration, which saves construction space, the decoupling surface of the coupling devices is in each case antiparallel to the detection surface, preferably orthogonal to the detection surface.

Preferably, the ring forms a latching contour for cooperation with at least one latching lug formed on the handling means or attached to the handling means.

Furthermore, the some embodiments relates to the use of the input device in one of the above-described embodiments in a motor vehicle.

The disclosed embodiments are explained further with reference to the following Figures. The Figures are to be understood only as examples and merely represent preferred variants of the embodiments. In the Figures:

DETAILED DESCRIPTION

Figure 1:
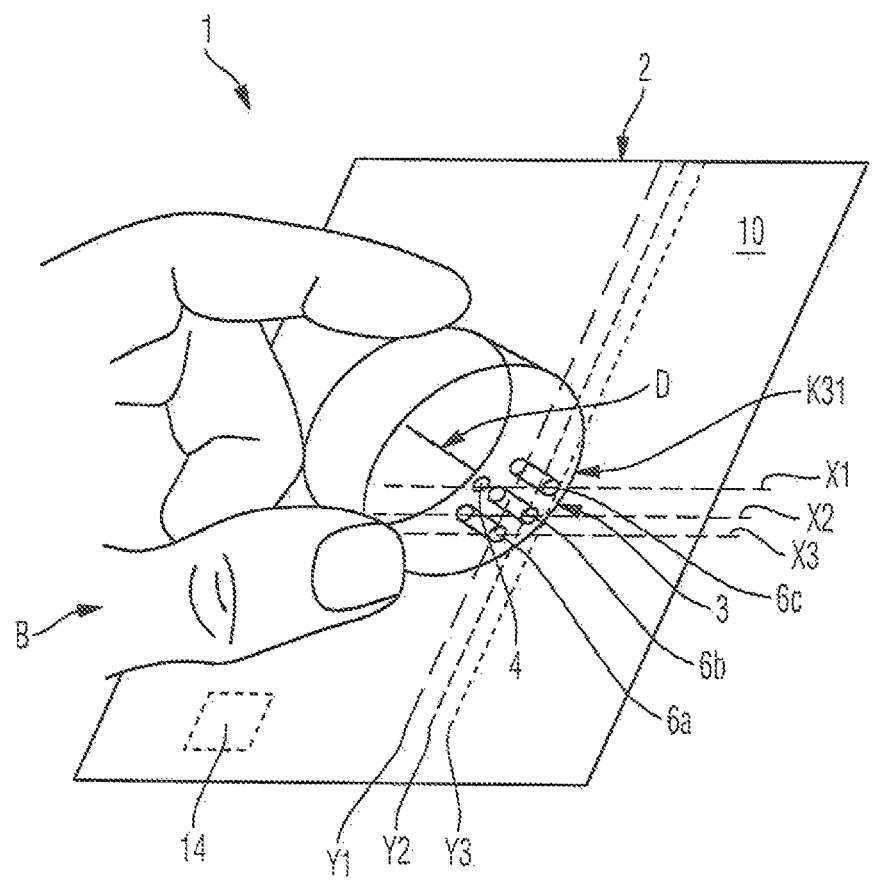
FIG. 1 shows a perspective top view of an embodiment of the input device 1 according to an embodiment.

FIG. 1 shows an input device 1 according to an embodiment, with a touchscreen functioning as a capacitive detection device 2. The detection device 2 defines a detection surface 10 facing towards the operator B, on which a handling means 3 is disposed so as to be mounted rotatably about an axis of rotation D, by means of the supporting means, which are not shown in FIG. 1 for better clarity, thus forming a so-called rotary adjuster. The capacitive detection device 2 has array electrodes X1 to X3 that extend parallel to each other, and array electrode Y1 to Y3 extending perpendicularly thereto. The array electrode grid is not depicted in full and to scale in the Figures and is only supposed to serve for schematic illustration of the general structure. The intersection points of the electrodes X1 to X3 with the electrodes Y1 to Y3 form an array of imaginary junction points K11 to K33. For reasons of clarity, only the junction point K13 defined by the intersection point of the array electrodes X1 and Y3 is labeled in the drawing. The numbering of the other junction points is analogous therewith.

An electronic evaluation unit 14 is electrically connected to the array electrodes X1 to X3 and Y1 to Y3, which, for generating an associated measuring field, applies a potential in each case to some of the electrodes, e.g. to the electrodes X1 to X3, selectively and in a sequence in time, in order to detect a touch by the operator B or, depending on the position of the respective junction points relative to the handling means 3, a position of the handling means 3, based on the influence on these measuring fields. In order to influence the respective measuring fields, the handling means 3 has on the side thereof facing towards the detection surface 10 a coupling electrode 4, which in the present embodiment is disposed in an electrically insulated manner with respect to the operator B while they are touching the handling means 3. Several positions are provided, in particularly ones that are uniformly distributed across the rotary adjustment range of the handling means 3, of which one possible position is shown in FIG. 1.

For improved capacitive coupling between the coupling electrode 4 and the measuring fields located at the junction points K11 to K33, several rod-shaped coupling devices 6a to 6c made from a conductive material, metal, a metallic conductive material or a metallic alloy are provided, depending on the position of the handling means 3, of which only three are shown in FIG. 1 for better clarity. In actual fact, more than three coupling devices, e.g. between 10 and 50, preferably 32 coupling devices 6a to 6c are provided, which are uniformly distributed in the circumferential direction about the axis of rotation D on the detection surface 10. Given a corresponding position of the handling means 3, the coupling devices 6a to 6c serve for providing capacitive couplings between the coupling electrode 4 and the junction points K11 to K33 associated with the respective coupling device 6a to 6c, so that the respective measuring fields are influences in the area of the junction points K11 to K33, which can be detected by the evaluation unit 14 and serves for the position detection of the evaluation unit 14, so that the latter is capable of outputting a positional information.

Figure 2:
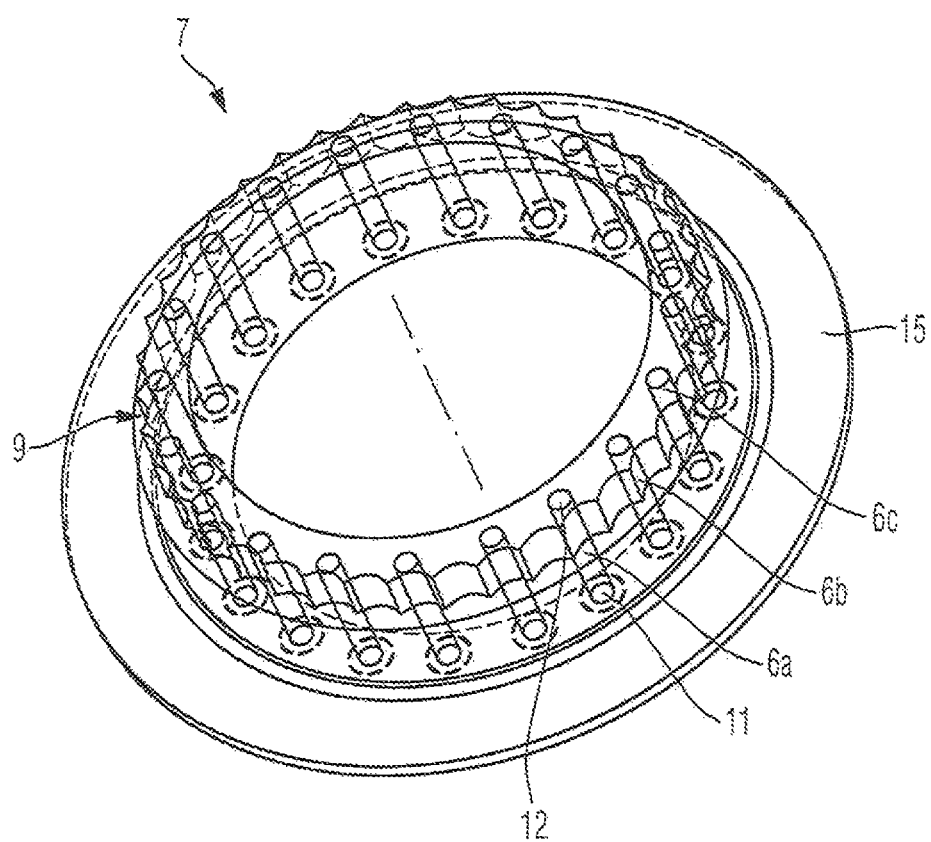
FIG. 2 shows a perspective view of the supporting means 7 and the coupling devices 6a to 6c connected therewith of the input device according to a first embodiment.

FIG. 2 shows a first embodiment of the supporting means 7, wherein the coupling devices 6a to 6c are positively accommodated in the material of the supporting means 7 by overmolding the coupling devices 6a to 6c with the material of the supporting means 7. The supporting means 7 form a ring of thermoplastic material in which the rod-shaped coupling devices 6a to 6c are accommodated. The ring has a flange 15 which serves for the arrangement and attachment, e.g. the positive connection, to the detection surface 10 shown in FIG. 1. The rod-shaped coupling devices 6a to 6c each form a bottom end face 11 respectively facing towards one of the array electrodes 5a to 5c shown in FIG. 1, and a top end face 12 facing towards the coupling electrode 4 shown in FIG. 1. Both end faces 11, 12 are each parallel to the detection surface 10 shown in FIG. 1 in the first embodiment shown in FIG. 2. The supporting means 7 configured as a ring have on their outer circumference a latching contour 9 cooperating with a latching lug, which is attached to the handling means 3 shown in FIG. 1 or formed by the handling means 3 and not shown in detail, in order to generate a haptically perceptible latching feel for the operator B when the handling means 3 is adjusted.

Figure 3:
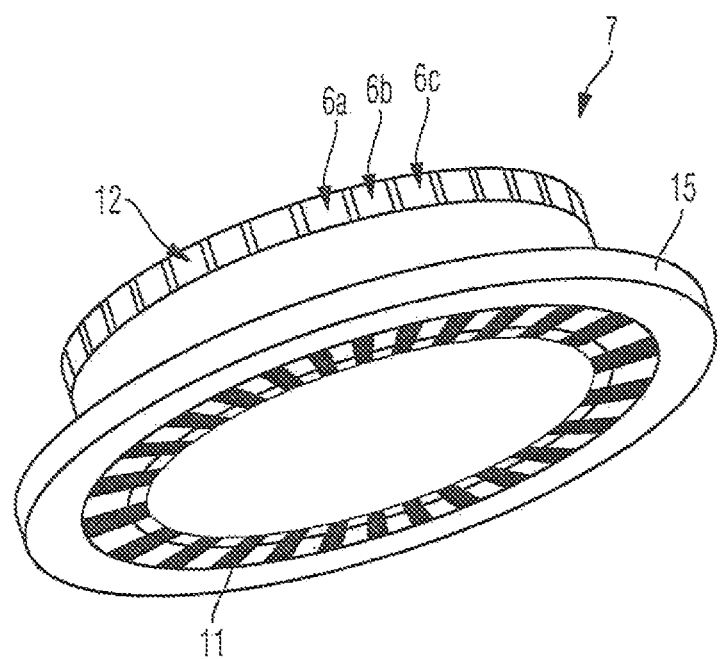
FIG. 3 shows a perspective view of the supporting means 7 and the coupling devices 6a to 6c connected therewith of the input device according a second embodiment.

FIG. 3 shows a second embodiment of the supporting means 7, in which the coupling devices 6a to 6c are also positively accommodated by overmolding. Also in this case, the supporting means 7 form a ring of thermoplastic material in which the coupling devices 6a to 6c are accommodated. Again, the ring has a flange 15 which serves for the arrangement and attachment, e.g. the positive connection, to the detection surface 10 shown in FIG. 1. The coupling devices 6a to 6c each form a bottom rectangular end face 11 respectively facing towards one of the array electrodes 5a to 5c shown in FIG. 1. It also forms a top rectangular end face 12 facing towards the coupling electrode 4 shown in FIG. 1. While the bottom end face 11 is in each case parallel to the detection surface 10 shown in FIG. 1, the top end face 12 facing towards the coupling electrode 4 is orthogonal to both. The supporting means 7 configured as a ring also have on their outer circumference a latching contour 9 cooperating with a latching lug, which is attached to the handling means 3 shown in FIG. 1 or formed by the handling means 3 and not shown in detail, in order to generate a haptically perceptible latching feel for the operator B when the handling means 3 is adjusted.

Figure 4:
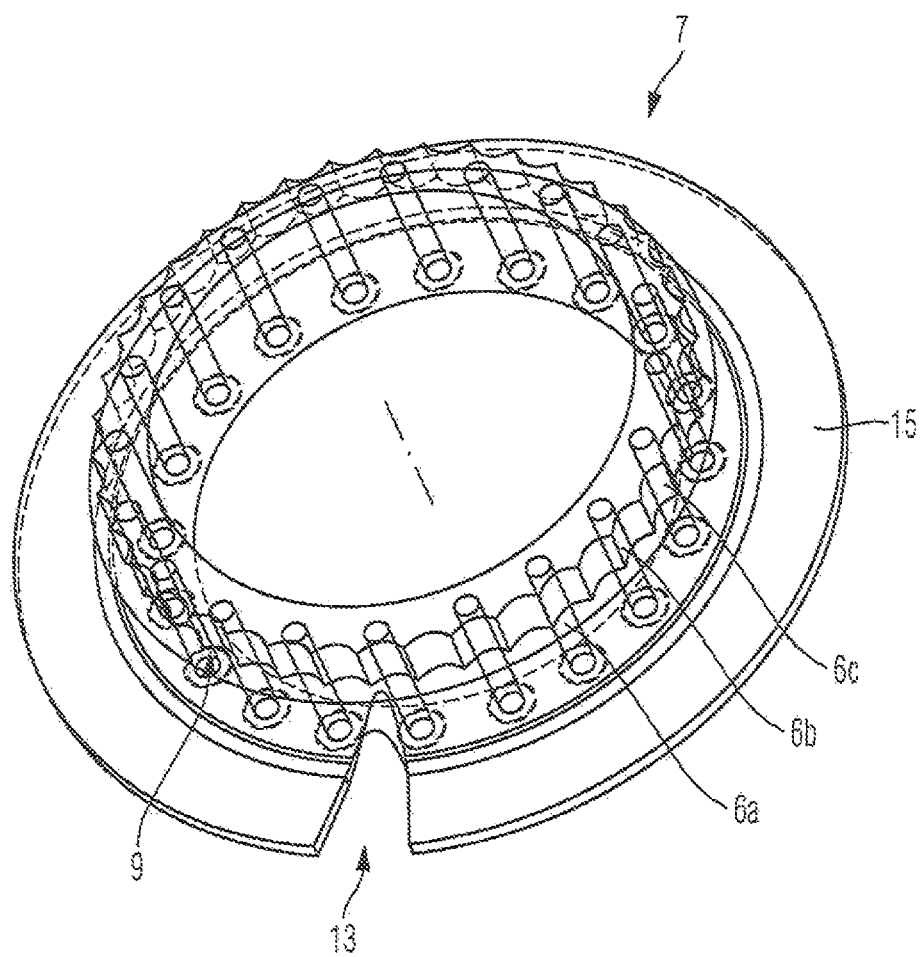
FIG. 4 shows a perspective view of the supporting means 7 and the coupling devices 6a to 6c connected therewith of the input device according a third embodiment.

FIG. 4 shows a third embodiment of the supporting means 7 based on the first embodiment. In this case, the coupling devices 6a to 6c are again positively accommodated in the supporting means 7 by overmolding. Also in this case, the supporting means 7 form a ring of thermoplastic material in which the coupling devices 6a to 6c are accommodated. Again, the ring has a flange 15 which serves for the arrangement and attachment, e.g. the positive connection, to the detection surface 10 shown in FIG. 1. The coupling devices 6a to 6c each form a bottom rectangular coupling surface 11 respectively facing towards one of the array electrodes 5a to 5c shown in FIG. 1, and a top rectangular end face 12, also referred to as decoupling surface or contact surface, which faces towards the coupling electrode 4 shown in FIG. 1. While the bottom end face 11 is in each case parallel to the detection surface 10 shown in FIG. 1, the top end face 12 facing towards the coupling electrode 4 is orthogonal to both. The supporting means 7 configured as a ring also have on their outer circumference a latching contour 9 cooperating with a latching lug, which is attached to the handling means 3 shown in FIG. 1 and formed by the handling means 3 and not shown in detail, in order to generate a haptically perceptible latching feel for the operator B when the handling means 3 is adjusted. In contrast to the first embodiment, a lateral recess 13 extending through the flange 15 is formed in the supporting means 7, which serves for draining a fluid that could otherwise possibly and undesirably collect in the interior of the ring.

Figure 5:
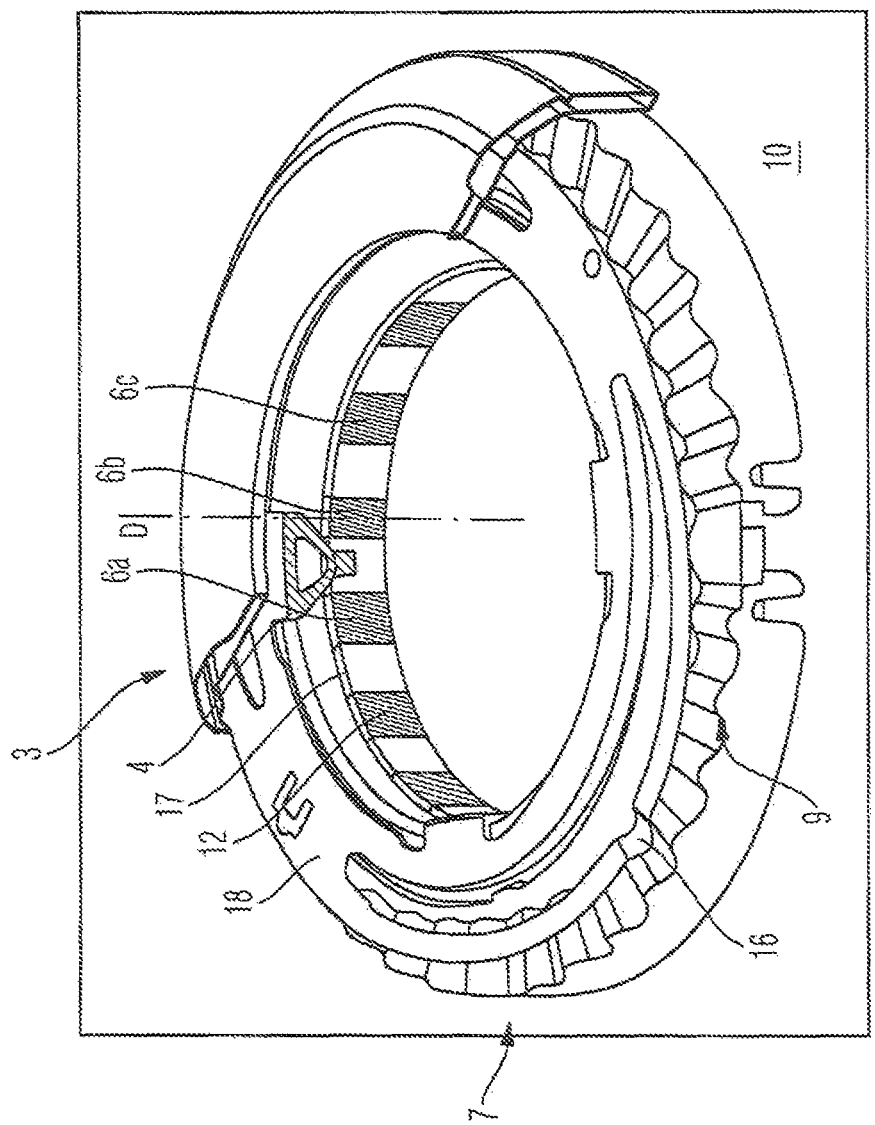
FIG. 5 shows a perspective view of the supporting means 7 and the associated handling means 3 of the input device according to a fourth embodiment.
Figure 6:
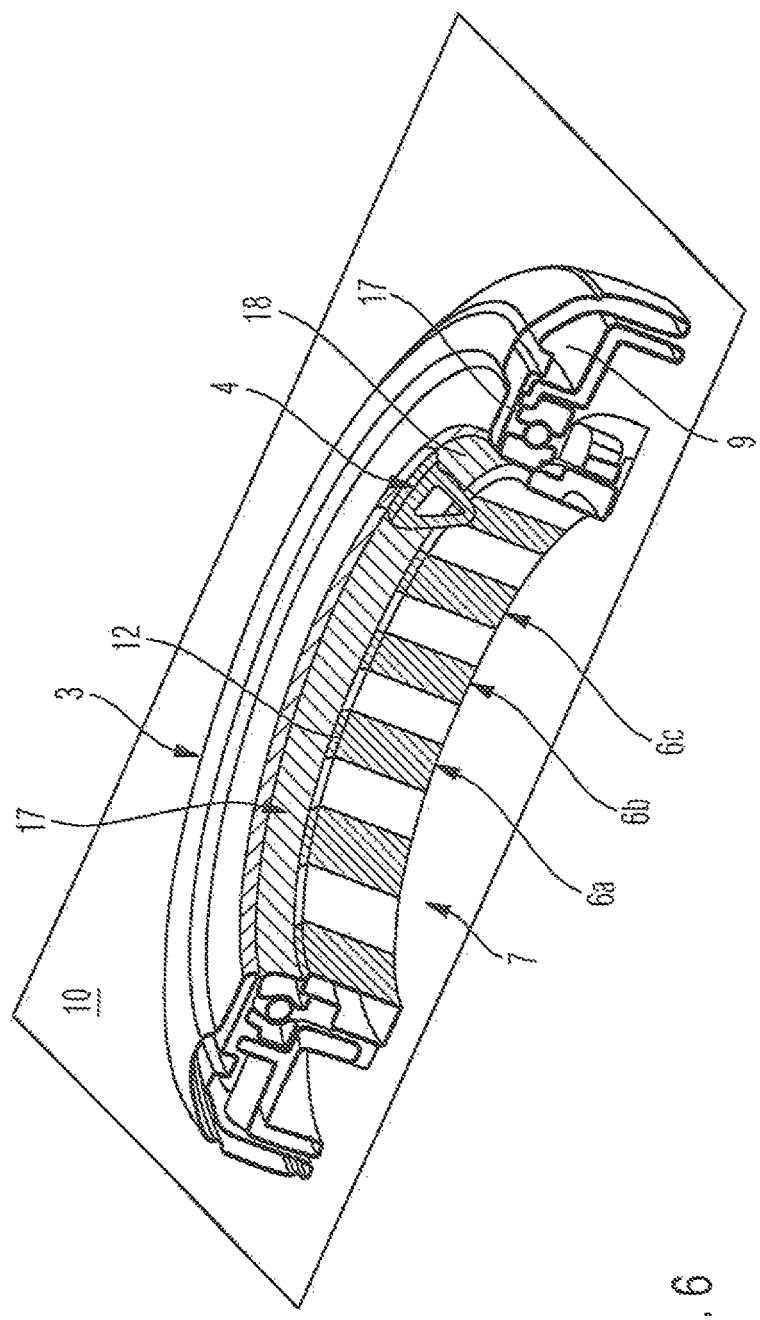
FIG. 6 shows another perspective view of the supporting means 7 and the associated handling means 3 of the input device according to the fourth embodiment.
Figure 7:
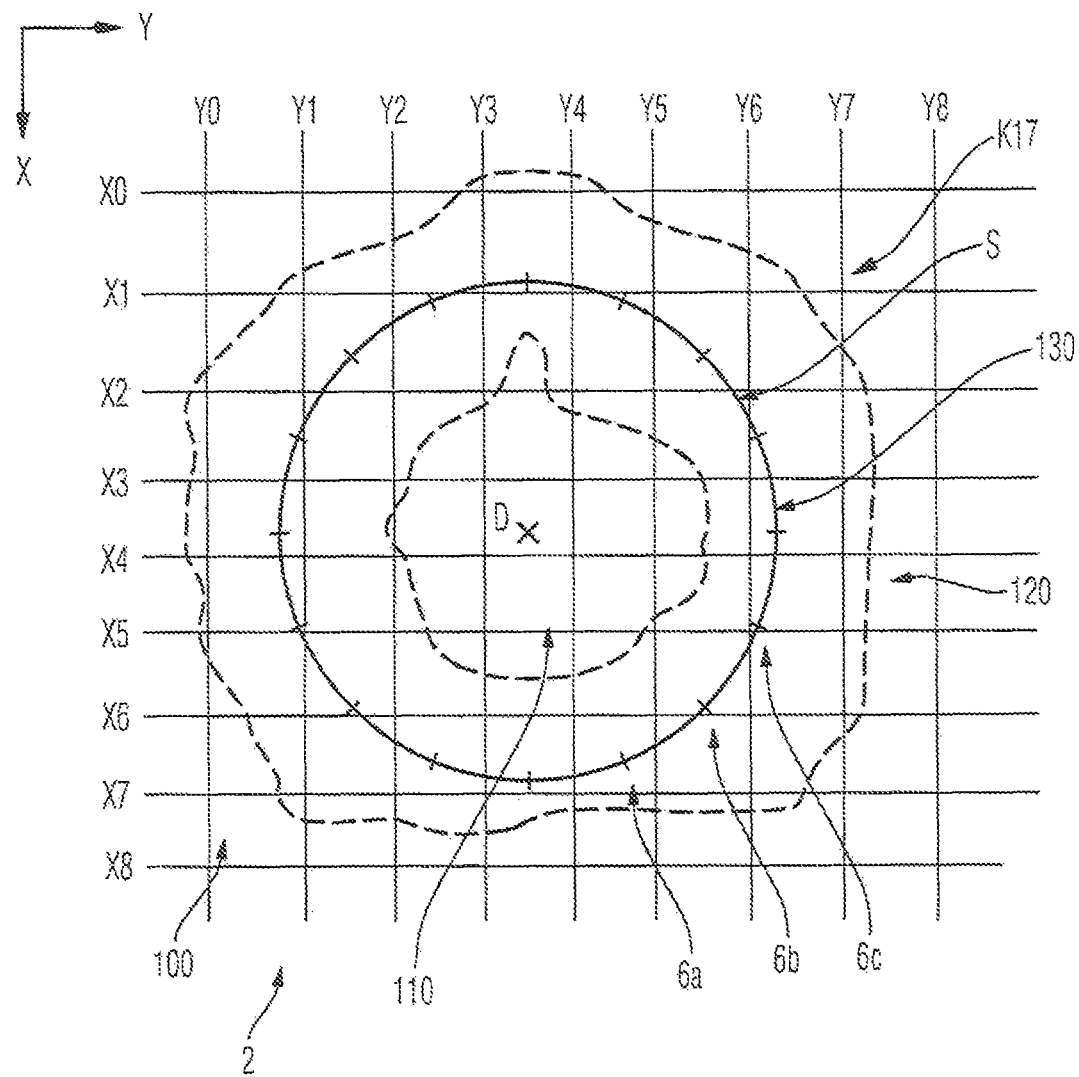
FIGS. 7 to 11 each show a schematic representation of one associated detection device 2 according to an embodiment.

FIGS. 5 and 6 show the supporting means 7 and the handling means 3 of a fourth embodiment of the input device according to an embodiment. The latter has a conductive metal sheet 18 configured as a stamped bent part. Via a ball bearing 17, which is associated with the supporting means 7 and is electrically connected to the conductive metal sheet 18, the handling means 3 is rotatably supported on the detection surface 10 associated with the detection device not shown. Together, the metal sheet 18 and the ball bearing 17 form the coupling electrode 4. The supporting means 7 have a latching contour 9 into which a latching lug 16 formed on the handling means 3 engages in a direction parallel to the axis of rotation D in order to generate a latching feel. The coupling devices 6a, 6b, 6c, which are in each case electrically contacted, depending on the position, by the coupling electrode 4 are configured as a plated layer applied to an inner circumferential surface of the supporting means 7 configured as a ring, and respectively define a contact surface 12 facing towards the coupling electrode 4. The handling means 3 is mounted, by means of a mechanism not shown herein, so as to be tiltable relative to the detection surface 10 in a restoring manner from a rest position into an end position. In the end positions, the ball bearing 17 comes very close to several of the decoupling surfaces or contact surface 12 or touches them, whereby a second capacitive coupling or an electrical contact is produced between the coupling electrode 4 and several coupling devices 6a to 6c, and thus to several measuring fields, which are not shown in detail herein, of a multi-region not shown herein.

FIGS. 7 to 11 show a schematic representation of a detection device 2 according to an embodiment with a detection surface 100 and, in each case, one grid of array electrodes X0 to X8 extending parallel to each other and array electrodes Y0 to Y8 electrically insulated from and crossing the latter. These are the electrodes of a capacitive detection device 2 with a projected capacitive technology, in particular with a mutual-capacitance structure. In this structure, measuring fields, and thus measuring capacitances, are generated at the intersection points between, in each case, two electrically insulated intersecting electrode structures. Here, the intersection points are referred to as junction points K00 to K88 and are arranged in a right-angled grid. For reasons of clarity, only the junction point K17 defined by the intersection point of the array electrodes X1 and Y7 is labeled in the FIGS. 7 to 11. The numbering of the other junction points is analogous therewith.

An electronic evaluation unit 14, which is not shown here, is electrically connected to the array electrodes, preferably connected therewith in an electrically conductive manner, is capable of measuring the influence on the capacitive measuring field of each individual junction point. If the respective measuring field is influenced by the external approach of an object, the electrical measuring capacitance measured by the evaluation unit at the respective junction point is altered and detected, and can be associated with a location on the detection surface due to the electrode structure with a pattern of rows and columns and the arrangement of the intersection points.

The Figures also show an axis of rotation D orthogonal to the detection surface, about which a handling means 3, which is not shown here, is mounted on the detection surface so as to be rotatable along an adjustment path S described by the arrangement of the coupling devices. The adjustment path S thus encloses a circular inner region 110 of the detection surface 100. The part of the detection surface 100 situated outside the adjustment path S is the outer region 120. Small lines crossing the adjustment path S at right angles symbolize coupling devices 6a to 6C disposed on the detection surface 100. Via the coupling devices, there are capacitive couplings between several junction points K00 to K88 and the coupling electrode 4, depending on the position of the coupling electrode 4. In the process, the entirety of the junction points K00 to K88, which are capacitively coupled with the coupling electrode 4 at any one of the possible positions of the coupling electrode 4, is situated within a partial region of the detection surface 100, the so-called influencing region 130. In other words, all junction points K00 to K88 that can be capacitively influenced by the coupling electrode 4 are situated within the influencing region 130.

There are junction points K00 to K88 that are not situated in the influencing region 130 both within the inner region 110 and in the outer region 120. These junction points K00 to K88 may be used for the detection of further functional capabilities of the input device 1, such as the recognition of a touch by the user or the like.

Figure 8:
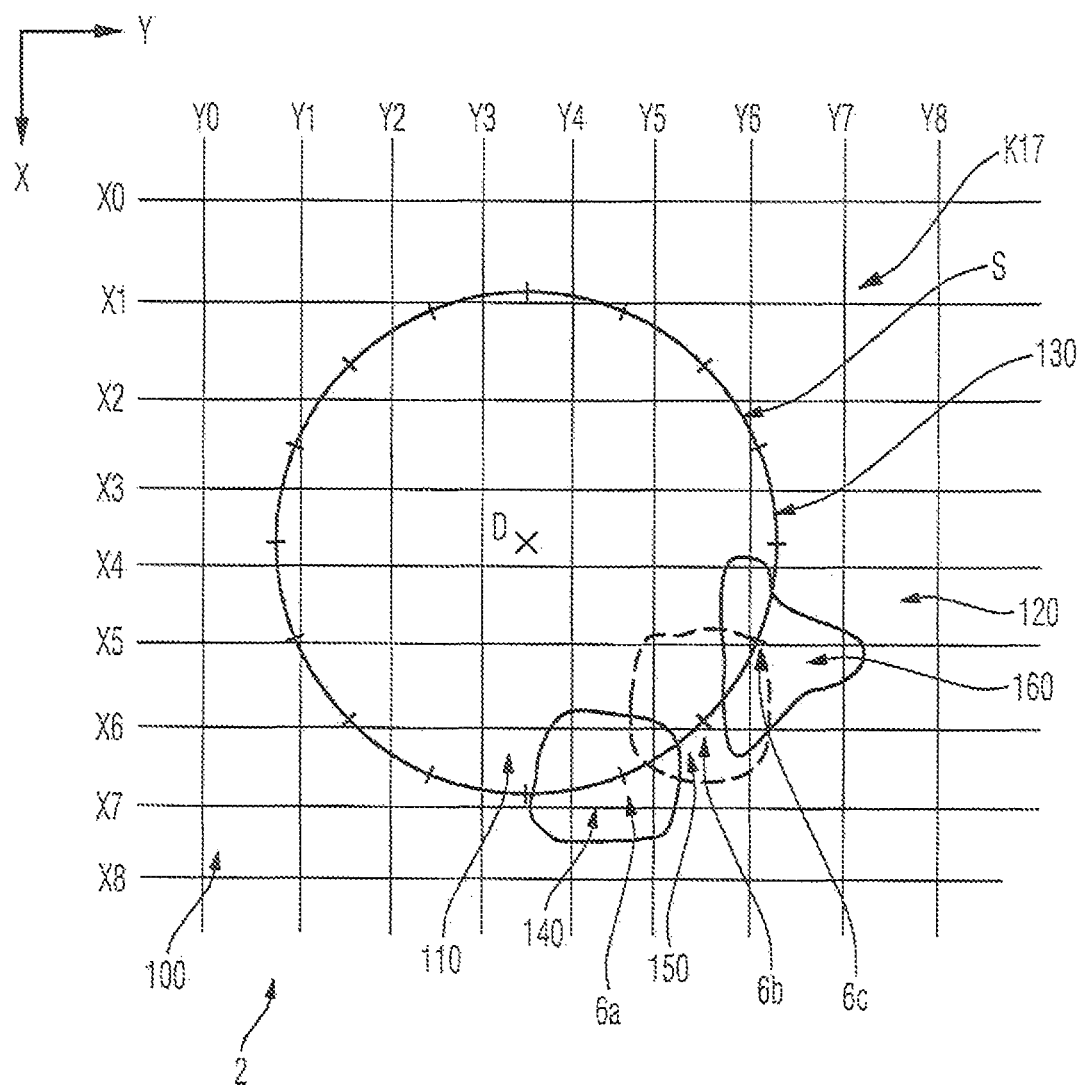

FIG. 8 shows, in particular, the partial regions 140, 150 and 160 respectively associated with the coupling devices 6a, 6b and 6c. In this case, the coupling device 6a is surrounded by the four junction points K64, K65, K74 and K75. In case of a position in which the coupling electrode 4, which not shown here, is most closely adjacent to the coupling device 6a, capacitive couplings occur between these junction points K64, K65, K74 and K75 and the coupling electrode 4, which are detected by the evaluation unit 14. This also applies analogously for the partial regions 150 and 160 associated with the coupling devices 6b and 6c. Depending on the partial region 140, 150, 160 in which the evaluation unit detects capacitive couplings, the evaluation unit 14 can obtain and output a positional and/or movement information of the handling means 3.

Figure 9:
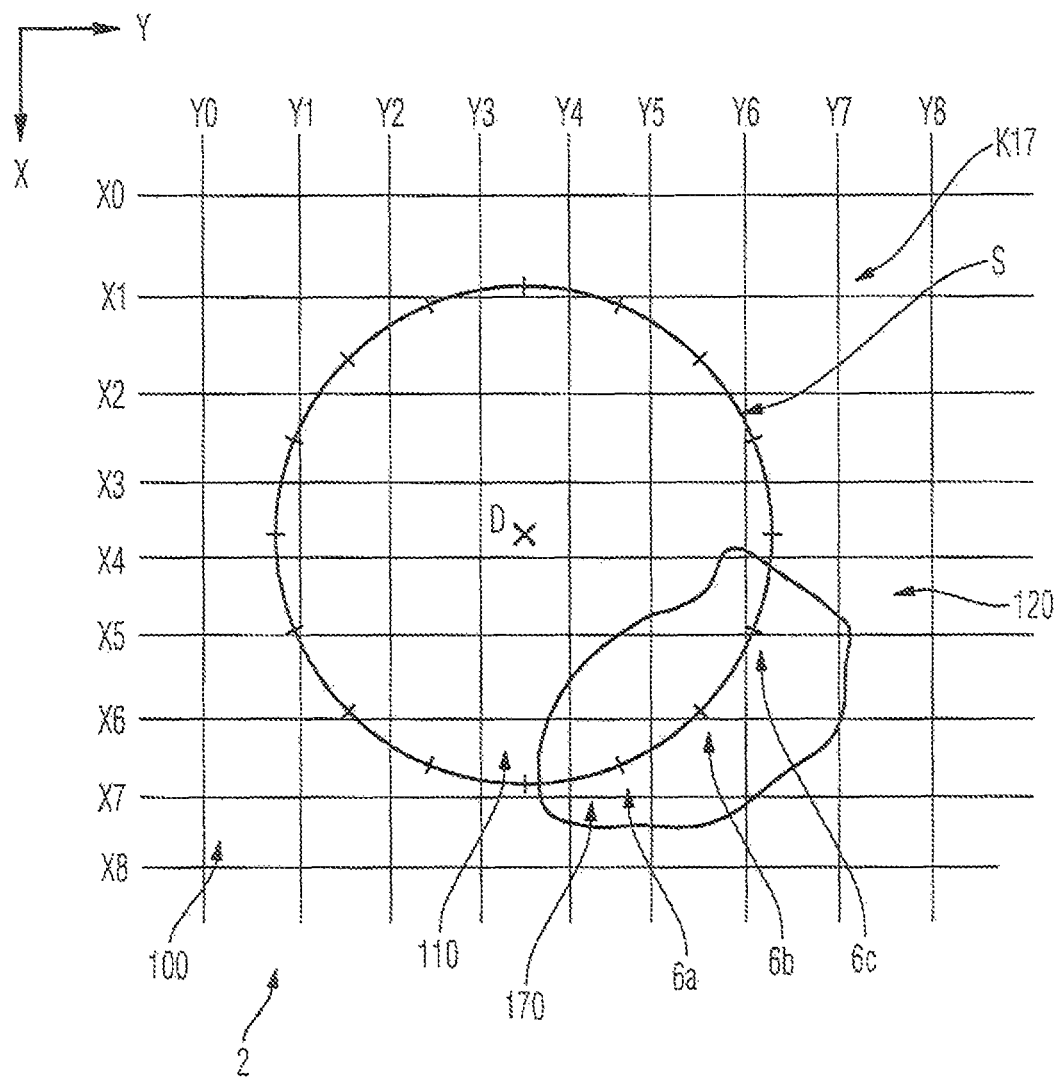

FIG. 9 shows, in particular, the multi-region 170 associated with the coupling devices 6a, 6b and 6c. In this case, the multi-region is composed of the three partial regions 140, 150 and 160 and thus constitutes their set union. In a position, e.g. a tilted position, of the handling means 3, in which the coupling electrode is most closely adjacent to the three coupling devices 6a, 6b and 6c, all junction points K00 to K88 situated within this multi-region are capacitively influenced. This is detected by means of the evaluation unit 14, which can obtain from this information a direction-specific—i.e. "bottom right"—tilt information.

Figure 10:
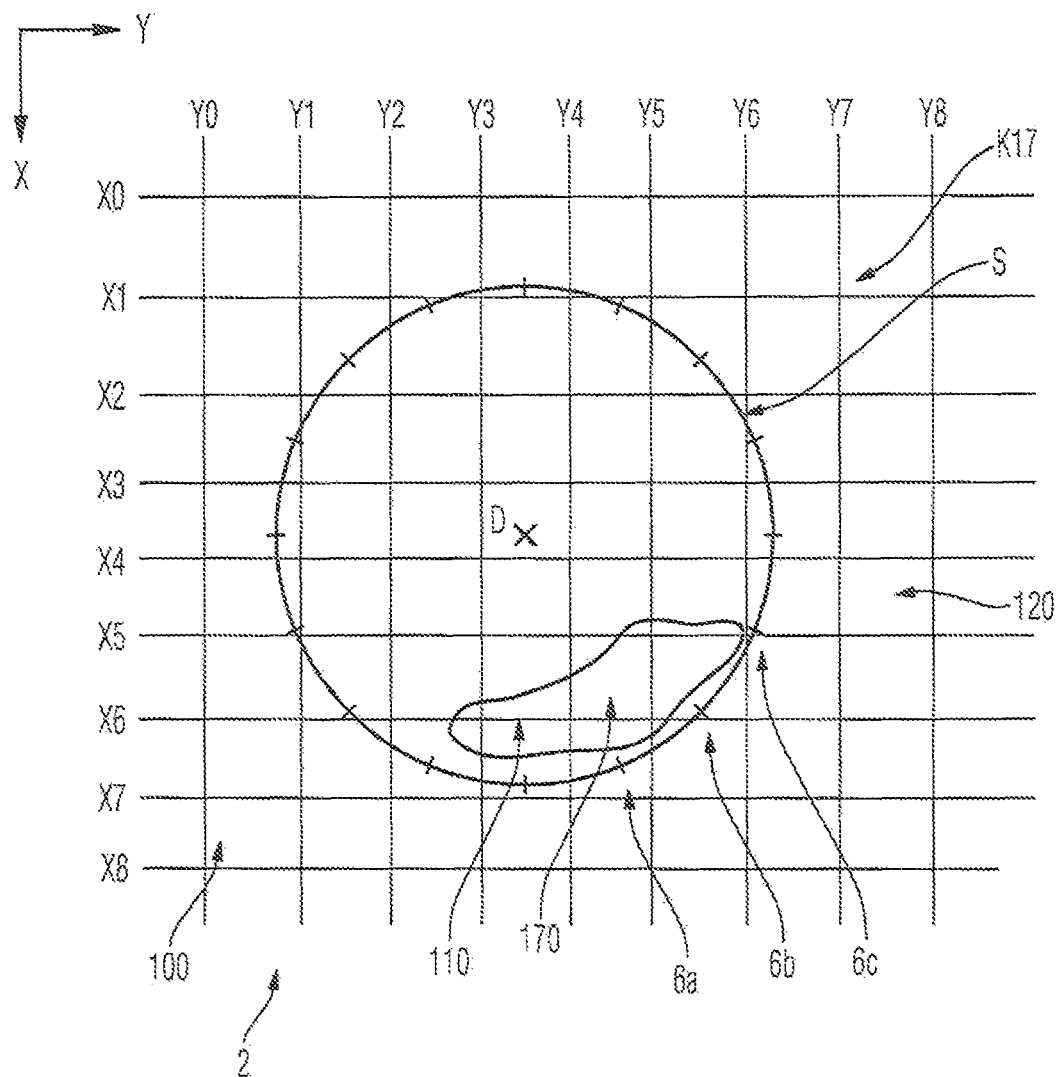
Figure 11:
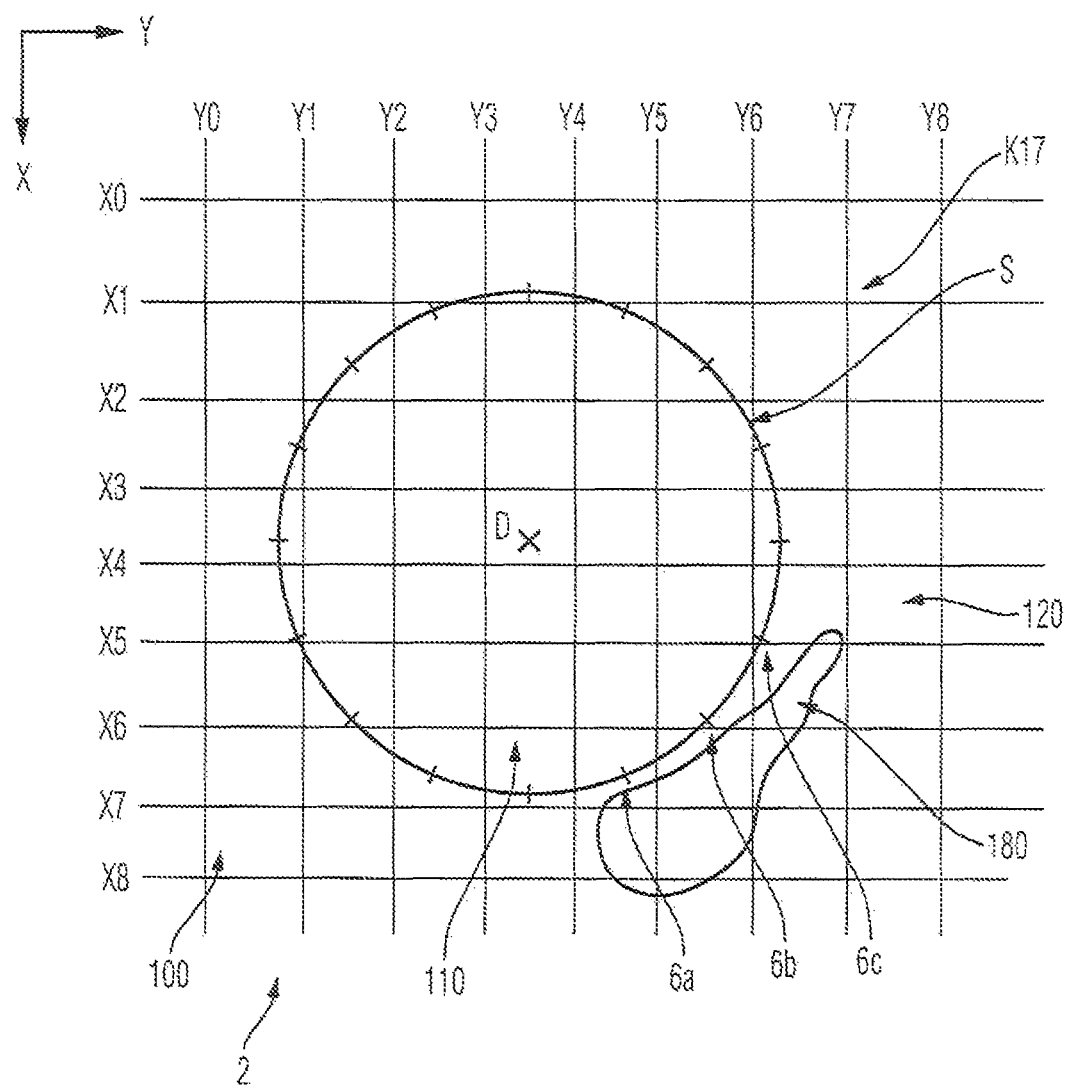

FIGS. 10 and 11 show situations in which a capacitive influence due to water is present. In FIG. 10, a drop of water, which is not shown, lies within a small region 170 in the inner region 110 of the detection surface 100. Capacitive couplings between the drop of water and the junction points occur only within this region. This applies analogously for a drop of water situated, as is shown in FIG. 11, in a small region 180 within the outer region 120 of the detection surface. Accordingly, only junction points in parts of the partial regions 140, 150, 160 and of the multi-region 170 are capacitively influenced in both situations. This can be detected by the evaluation unit 14. The detection results can be in that case be used further by the evaluation unit, in order to detect an interfering influence on the input device.

What is claimed is:
1. An input device, comprising:
a capacitive detection surface having associated therewith two spatially overlapping arrays of electrodes;
processing circuitry that is electrically connected to the arrays of electrodes and is adapted to form, through use of the arrays of electrodes, an associated array of electrical measuring fields for spatially resolving detection of a capacitive influence on the capacitive detection surface;
a handle having a first degree of freedom of movement about an axis of rotation, the handle is located over the capacitive detection surface by a bearing, the handle being movable along an adjustment path when moved by being touched by an operator;

a coupling electrode that moves at least partially along with movement of the handle; and a plurality of coupling devices made of a conductive material, each of the coupling devices being insulated from each other and the electrodes of the arrays, being distributed along the adjustment path, and being disposed by the bearing over the capacitive detection surface positioned so that a plurality of adjacent ones of the measuring fields are each capacitively coupled to an associated coupling device of the plurality of coupling devices, wherein the measuring fields associated with each respective coupling device of the plurality of coupling devices define exactly one partial region of the capacitive detection surface; and wherein a plurality of positions of the handle exist along the adjustment path such that the coupling electrode, depending on its position, is arranged most closely adjacent to at least one of the coupling devices so as to, depending on the position of the coupling electrode, be electrically in contact with the most closely adjacent at least one of the coupling devices or be capacitively coupled to the most closely adjacent at least one of the coupling devices; and wherein the processing circuitry is adapted to detect a position-dependent influence on the measuring fields caused by the capacitive coupling of the coupling devices in order to develop and supply as an output position information of the handle;

wherein the handle has a second degree of freedom of movement in that it can be freely displaced in relation to the capacitive detection surface in a restoring manner from a rest position into an end position, the handle being supported so as to be arbitrarily tiltable, wherein the end position is in each case such that the coupling electrode at least one of (i) electrically contacts at least two of the plurality of coupling devices and (ii) is capacitively coupled with at least two of the plurality of coupling devices, so that at least two of the electrical measuring fields are capacitively influenced, wherein the at least two of the electrical measuring fields that are capacitively influenced are each associated with a respective partial region such that the partial regions taken collectively define a multi-region of the capacitive detection surface; and wherein the processing circuitry is further adapted to detect the capacitive influence on the measuring fields associated with the multi-region caused by displacement of the handle into the end position, in order to further develop and supply as an output information regarding displacement of the handle, the output information regarding the displacement of the handle including information characterizing an arbitrary tilt of the handle.

2. The input device according to the claim 1, wherein the electrodes of the arrays have overlapping points arranged as a grid structure, and a position of the measuring fields is defined by the overlapping points of the grid structure.

3. The input device according claim 1, wherein the electrodes of the arrays are maintained constantly in a state of insulation from each other.

4. The input device according to claim 1, wherein the coupling devices associated with a multi-region are situated most closely adjacent to each other.

5. The input device according to claim 1, wherein the coupling electrode comprises a portion of a ball bearing.

6. The input device according to claim 1, wherein the handle is mounted on the capacitive detection surface so as to be movable about the axis of rotation orthogonal to the detection surface, and the adjustment path defines a substantially circular inner region of the capacitive detection surface.

7. The input device according to claim 6, wherein at least one measuring field is located outside all of the partial regions and all multi-regions exist in the inner region.

8. The input device according to claim 6, wherein the plurality of coupling devices are distributed about the axis of rotation.

9. The input device according to claim 1, wherein the plurality of coupling devices are attached to the bearing.

10. The input device according to claim 9, wherein the plurality of coupling devices are connected to the bearing in at least one manner from the group consisting of: positively, non-positively and substance-to-substance connection.

11. The input device according to claim 1, wherein the bearing comprises a ring of plastic in which the coupling devices are disposed.

12. The input device according to claim 11, wherein the ring has a latching contour adapted to cooperate with at least one latching lug formed on the handle.

13. The input device according to claim 1, wherein the capacitive detection surface is part of one of the group consisting of a touchpad and a touchscreen.

14. A motor vehicle comprising the input device according to claim 1.

15. The input device according to claim 1, wherein the partial region is contiguous.

16. The input device according to claim 1, wherein the handle is substantially ring-shaped.

17. The input device according to claim 1, wherein the coupling electrode is electrically isolated from an operator touching the handle.

18. The input device according to claim 1, wherein the coupling electrode comprises a sheet-metal stamped bent part.

19. The input device according to claim 1, wherein the arrays of electrodes are electrically isolated from each other.

20. The input device according to claim 1, wherein the multi-region is contiguous.

21. An input device, comprising:
a capacitive detection surface having associated therewith two spatially overlapping arrays of electrodes;
processing circuitry that is electrically connected to the arrays of electrodes and is adapted to form, through use of the arrays of electrodes, an associated array of electrical measuring fields for spatially resolving detection of a capacitive influence on the capacitive detection surface;
a handle having a first degree of freedom of movement about an axis of rotation, the handle is located over the capacitive detection surface by a bearing, the handle being movable along an adjustment path when moved by being touched by an operator;
a coupling electrode that moves at least partially along with movement of the handle; and
a plurality of coupling devices made of a conductive material, each of the coupling devices being insulated from each other and the electrodes of the arrays, being distributed along the adjustment path, and being disposed by the bearing over the capacitive detection surface positioned so that a plurality of adjacent ones of the measuring fields are each capacitively coupled to an associated coupling device of the plurality of coupling devices, wherein the measuring fields associated with each respective coupling device of the plurality of coupling devices define exactly one partial region of the detection surface; and wherein a plurality of positions of the handle exist along the adjustment path such that the coupling electrode, depending on its position, is arranged most closely adjacent to at least one of the coupling devices so as to, depending on the position of the coupling electrode, be electrically in contact with the most closely adjacent at least one of the coupling devices or be capacitively coupled to the most closely adjacent at least one of the coupling devices; and wherein the processing circuitry is adapted to detect a position-dependent influence on the measuring fields caused by the capacitive coupling of the coupling devices in order to develop and supply as an output position information of the handle;

wherein the handle is freely tiltable and displaceable into a plurality of direction-specific end positions relative to the capacitive detection surface, and one direction-specific multi-region exists for each of the direction-specific end positions, and the processing circuitry is further adapted to detect the capacitive influence on the measuring fields associated with the direction-specific multi-regions caused by displacement of the handle into each respective direction-specific end positions so as to develop and supply as an output direction-specific displacement information for the handle and information regarding an arbitrary tilt of the handle.

* * * * *